(12) United States Patent
Maury et al.

(10) Patent No.: US 8,343,582 B2
(45) Date of Patent: *Jan. 1, 2013

(54) PROCESS FOR DEPOSITION OF NON-OXIDE CERAMIC COATINGS

(75) Inventors: Francis Maury, Lebège (FR); Aurélia Douard, Béthune (FR)

(73) Assignee: Institut National Polytechnique de Toulouse (I.N.P.T.), Toulouse (FR)

( * ) Notice: Subject to any disclaimer, the term of this patent is extended or adjusted under 35 U.S.C. 154(b) by 723 days.

This patent is subject to a terminal disclaimer.

(21) Appl. No.: 12/374,555

(22) PCT Filed: Jul. 19, 2007

(86) PCT No.: PCT/EP2007/057463
§ 371 (c)(1),
(2), (4) Date: Sep. 29, 2009

(87) PCT Pub. No.: WO2008/009715
PCT Pub. Date: Jan. 24, 2008

(65) Prior Publication Data
US 2010/0047449 A1 Feb. 25, 2010

(30) Foreign Application Priority Data

Jul. 21, 2006 (FR) ..................... 0606660

(51) Int. Cl.
C23C 16/32 (2006.01)
C23C 16/34 (2006.01)
C23C 16/36 (2006.01)

(52) U.S. Cl. ........... 427/249.1; 427/249.18; 427/255.31; 427/255.394

(58) Field of Classification Search ............... 427/249.1, 427/249.18, 255.31, 255.394
See application file for complete search history.

(56) References Cited

U.S. PATENT DOCUMENTS

| 5,149,596 A * | 9/1992 | Smith et al. .................... 428/656 |
| 5,302,422 A | 4/1994 | Nowak et al. |
| 5,954,046 A * | 9/1999 | Wegler ........................ 126/617 |
| 6,238,734 B1 * | 5/2001 | Senzaki et al. ................. 427/226 |
| 6,319,567 B1 | 11/2001 | Senzaki et al. |
| 6,569,249 B1 * | 5/2003 | Singh et al. ................... 118/666 |
| 2001/0020448 A1 * | 9/2001 | Vaartstra et al. ............... 118/724 |
| 2003/0154880 A1 * | 8/2003 | Marsh et al. .................. 106/1.21 |
| 2004/0076837 A1 * | 4/2004 | Hein et al. .................... 428/446 |
| 2009/0324822 A1 * | 12/2009 | Maury et al. .................. 427/252 |

OTHER PUBLICATIONS

Endle, J.P., et al., "Titanium-aluminum nitride film growth and related chemistry using dimethylamino-based precursors." Thin Solid Films 385 (2001), pp. 66-73.*
Senzaki, Yoshihide, et al., "MOCVD of High-k Dielectrics, Tantalum Nitride and Copper from Directly Injected Liquid Precursors". Advanced Materials of Optics and Electronics, 10, 93-103 (2000).*
Douard, A., et al., "Nanocrystalline chromium-based coatings deposited by DLI-MOCVD under atmospheric pressure from Cr(CO)6". Surface and Coatings Technology 200 (2006) 6267-6271.*
Li, Zhefeng, et al., "Direct-Liquid-Injection Chemical Vapor Deposition of Nickel Nitride Films and Their Reduction to Nickel Films". Chem. Mater. 2010, 22, 3060-3066.*
Boisselier, G., et al., "Growth of Chromium Carbide in a Hot Wall DLICVD Reactor". Journal of Nanoscience and Nanotechnology, vol. 11, 8289-8293, 2011.*
Song, Moon-Kyun, et al., "Direct liquid injection metal-organic chemical vapor deposition of HfO2 thin films using Hf(dimethylaminoethoxide)4". Thin Solid Films 450 (2004), 272-275.*
Dubourdieu, C., et al., "Pulsed liquid-injection metalorganic chemical vapor deposition of (La0.7Sr0.3MnO3/SrTiO3)15 superlattices". Applied Physics Letters, vol. 79, No. 9, Aug. 27, 2001, pp. 1246-1248.*
"Nanocrystalline chromium-based coatings deposited by DLI-MOCVD under atmospheric pressure from Cr(CO)6" Surface and Coatings Technology, Elsevier Amsterdam, NL, vol. 200, No. 22-23, dated Jun. 20, 2006, pp. 6267-6271. XP005422291.
International Search Report issued on Oct. 10, 2007. Application No. PCT/EP2007/057463.

* cited by examiner

Primary Examiner — Bret Chen
(74) Attorney, Agent, or Firm — Young & Thompson (57) ABSTRACT

A method for depositing a non-oxide ceramic-type coating based on chrome carbides, nitrides or carbonitrides, by DLI-CVD at low temperature and atmospheric pressure on a metallic substrate, includes: a) a solution is prepared, containing a molecular compound which is a precursor of the metal to be deposited, belongs to the bis(arene) family, and has a decomposition temperature of 300° C.-550° C., the compound being dissolved in an oxygen atom depleted solvent; b) the solution is introduced as aerosol into a heated evaporator at a temperature between the solvent boiling temperature and the precursor decomposition temperature; and c) the precursor and the vaporized solvent are driven from the evaporator towards a CVD reactor having cold walls, with a susceptor carrying the substrate to be covered and heated to a temperature higher than the decomposition temperature of the precursor, to a maximum of 550° C., the evaporator and the CVD reactor being at atmospheric pressure.

20 Claims, 4 Drawing Sheets

PROCESS FOR DEPOSITION OF NON-OXIDE CERAMIC COATINGS

FIELD OF THE INVENTION

This invention relates to the field of coatings for the protection of metal parts that work under severe conditions against wear, corrosion or high-temperature oxidation.

It has as its object a process for dry deposition of non-oxide ceramic coatings such as carbides, nitrides or carbonitrides of metal elements, in particular based on chromium, making it possible to obtain monolayer coatings or stacks of nanostructured layers. It also has as its object a process for producing high-strength metal parts for the mechanical industry.

BACKGROUND OF THE INVENTION

The current requirements of the mechanical industries are growing in terms of materials that withstand severe conditions of use. Numerous tools, such as the tools for cutting, shaping, milling, and stamping, molds, roller bearings, etc., comprise metal parts that are subjected during their use to significant wear, to corrosion, or to high-temperature oxidation. The problems of wear, for example, bring about mechanical shutdowns and significant costs for repair and replacement of parts. To extend the service life of these metal parts—made of steel or alloys—it is possible to coat them with a fine layer, typically of several microns, of a non-oxide ceramic compound such as carbide, nitride, or carbonitride of a metal element, which improves their mechanical properties as well as their resistance to wear and to corrosion. Chromium is the most used metal element, but other transition metals that have similar properties are also used. The nanostructured coatings generate a high interest today because they are able to protect tools that operate under extreme conditions of wear and aggressive environments.

To be effective, the deposition is to be uniform over the entire surface, despite the large size of the parts; it is to be free of oxide and produced by techniques that do not interfere with functional properties of the treated tools. In particular, the temperature conditions during the deposition should lead neither to a deformation of parts, nor to a structural transformation. In addition, a process is sought whose conditions of use can be easily industrialized and economically inexpensive. From this standpoint, the possibility of laying down deposits for atmospheric-pressure protection is of primary importance because it makes it possible to consider online treatment of large parts in a stream. Finally, the process that is as least polluting as possible is sought. The processes for wet deposition (treatment by immersion in a bath or electrodeposition) are therefore prohibited because of the effluent wastes loaded with toxic compounds that they generate. They will also soon be prohibited in Europe.

Obtaining non-oxide ceramic-type coatings by dry deposition techniques is well known. Among the latter, chemical deposition techniques (CVD, for Chemical Vapor Deposition) and physical chemical deposition techniques (PVD, for Physical Vapor Deposition) have been mastered and are already used in production.

For example, the chemical vapor-phase deposition of nitrides, carbides or carbonitrides of metal elements from a cement that consists of a metal powder in contact with a high-temperature volatile reducing compound is known. Regarding the chromium-based deposits, the metal powder is confined in the presence of a halide ($NH_4F$ or $HF$) and brought to a high temperature (950-1050° C.). Thus, deposits of chromium carbide (with the addition of hydrocarbon gas), chromium nitride ($NH_4F$ decomposing into $H_2$ and $N_2$, high-temperature nitrating mixture), or carbonitrides ($NH_4F$+hydrocarbons) are obtained. This process can operate at atmospheric pressure, but the deposits are obtained only at high temperature because of the halide-type metal source that is used. The so-called "standard" CVD processes, directly using corresponding halide vapors as a chromium source, operate under dynamic vacuum and at high temperature.

These two CVD processes that are strongly activated thermally make possible the treatment of complex surfaces, but their primary drawbacks are (i) the use of thermally robust, toxic and corrosive halide precursors with limited volatility and (ii) high temperatures of deposition that, on metal substrates, will cause dimensional deformations, modification of microstructure, and changes in crystalline structure, causing the degradation, and even the loss, of specific functional properties of the tool.

To bring the deposition temperatures below 550° C., considered to be the critical holding temperature of steels and alloys, organometallic molecular precursors have been used (MOCVD process, for Metal Organic CVD). However, taking into account the low volatility and the thermal instability of these compounds that are often powders, it is necessary to operate under reduced pressure. In addition, the extended heating of the precursor in the sublimation zone, even at low temperature, can degrade the reagent before it arrives in vapor form at the deposition zone, thus involving problems of reproducibility in terms of flow rate, the initial reactive gas composition, and therefore the deposit quality.

A particular process of MOCVD deposition uses a plasma torch to thermally decompose the organometallic chromium precursors. The use of a plasma torch does not, however, make possible deposition on a heat-sensitive metal, nor does it make it possible to apply a uniform coating on large parts unless a scanning system of the plasma nozzle is provided, requiring complex technical controls. Treatment on large parts in a stream is therefore not conceivable by this technique.

Taking into account limits mentioned above of the CVD processes for deposition of protective metallurgical coatings, physical vapor-phase deposition (PVD) processes have been developed and proposed as an alternative to the CVD processes. They are generally considered to be a suitable deposition technique, without generating or using unstable, dangerous and/or corrosive chemical substances. They operate at a low temperature, which makes it possible to retain the basic specificities of the metal substrates that are to be treated. Numerous PVD processes for production of carbide-, nitride- and carbonitride-type coatings are described in the literature. Despite the investments in costly equipment, the size of the deposition frames is limited, the rate of growth is relatively low, and uniform deposition, even with target or rotating-substrate techniques, is obtained only for small parts. In all of the cases depicted, forced vacuum techniques are used, requiring sophisticated monitoring and regulation equipment. These PVD processes that bring about a low productivity are currently reserved for the treatment of lots of small high-value-added parts.

It thus appears that it has not been possible until now to carry out non-oxide ceramic depositions at low temperature and under atmospheric pressure, applicable for online treatment of large surfaces in a stream. This invention has as its object to meet this requirement. It has as its object a process that combines the principle of the chemical vapor-phase deposition and the liquid injection of a precursor of the metal compound to be deposited, called DLI-CVD for Direct Liquid Injection-Chemical Vapor Deposition.

The principle of the DLI-MOCVD technique is to introduce into a chemical vapor-phase deposition chamber a liquid precursor of the element to be deposited by periodic injection of droplets of said precursor that are entrained by a vector gas toward the deposition chamber. A DLI-MOCVD device has been developed for the deposition of thin layers of oxides on the micro-electronic plates, but it has never been used for the deposition of non-oxide ceramics at atmospheric pressure. This is due to the fact that work at atmospheric pressure, which offers a great advantage for the low-cost industrial production of large parts, imposes particular reaction conditions that have not been defined to date. Furthermore, the operating conditions are not easily transposable to the deposition of non-oxide layers. Actually, in the case of microelectronic layers, carbon contamination is to be prevented. However, whereby the latter results from the large quantity of hydrocarbon solvent in the reactor, it is more easily controlled when the decomposition is conducted in the presence of oxygen or an oxidizing gas ($N_2O$, $H_2O$, . . . ). Furthermore, for coatings intended for microelectronics, oxidized solvents are commonly used. A large part of the carbon is then eliminated by combustion whereas an oxide film is deposited, which is not compatible with the purpose of this invention.

SUMMARY OF THE INVENTION

This invention eliminates these drawbacks by a process that can be implemented at temperatures of less than 550° C. and at atmospheric pressure to deposit non-oxide ceramic layers on steel or alloy substrates. The process according to the invention thus makes it possible to consider the deposition in a stream of non-oxide ceramic protective layers on large metal plates under industrial conditions.

More specifically, this invention has as its object a process for deposition of a non-oxide ceramic-type coating based on carbides, nitrides or carbonitrides of chromium or metal elements whose chemical properties are similar to those of chromium, by chemical vapor-phase deposition on a metal substrate that essentially comprises the steps that consist in:

a) Taking a solution that contains a metal precursor molecular compound to be deposited and that belongs to the bis(arene) family and whose decomposition temperature is between 300° C. and 550° C., whereby said compound is dissolved in a solvent from which an oxygen atom has been removed, b) Introducing said precursor solution in aerosol form into an evaporator that is heated to a temperature of between the boiling point of the solvent and the decomposition temperature of the precursor, c) Entraining the precursor and the solvent that are evaporated by a neutral gas stream from the evaporator to a cold-wall CVD reactor comprising a susceptor that supports the substrate to be coated, heated to a temperature that is higher than the decomposition temperature of the precursor and at most 550° C., whereby the evaporator and the CVD reactor are subjected to atmospheric pressure.

The direct liquid injection technique is based on the introduction in the pulsed mode of a molecular solution of a metal precursor, fractionated into microdroplets to form an aerosol that is flash-evaporated in a heated evaporator at least to the boiling point of the selected solvent and considerably less than the decomposition temperature of the precursor and the solvent that are used. A gas stream that enters the nose of the injector brings the vapors of the precursor and the solvent from the evaporator to the deposition zone that consists of a susceptor that is heated by induction and that supports the substrate to be coated. A nitrogen-containing gas can be introduced into the system at the same time, preferably between the evaporator and the reactor, to obtain nitrides or carbonitrides.

According to an advantageous characteristic of the process according to the invention, the evaporator is heated, at a temperature that is less than at least 50° C. and preferably at least 100° C., to the decomposition temperature of the precursor compound. Thus, the aerosol is flash-evaporated, and any premature deposition on the walls of the evaporator is avoided.

The injection parameters of the precursor solution are preferably set using a computer program. They are adjusted so as to obtain a mist of fine and numerous droplets, a condition that is essential to the flash evaporation under atmospheric pressure. The fractionation of microdroplets of the solution can be carried out by means of, for example, a modified diesel automobile injector, regulated with a short opening time and a high injection frequency. According to an advantageous characteristic of the process according to the invention, the aerosol is obtained by injection in the pulsed mode with an opening time of less than 1 ms and a frequency of more than 4 Hz. The liquid injection thus constitutes a high-flow source of precursor solution, allowing a good yield of coating deposition.

The good performance of the process according to the invention, in particular its good hydrodynamic quality, requires high gas flow rates. The flow rate of neutral gas is advantageously between 4 cm/s and 10 cm/s. Thus, for a reactor of 50 mm in diameter, for example, the gas flow rate is regulated to more than 5,000 $cm^3$/mn. In the configuration where the evaporator is located coaxially above the CVD reactor, the flow benefits in addition from the gravitational force.

The neutral gas that is used as a vector gas is preferably to be preheated, at a minimum to the temperature of the evaporator, to obtain an effective evaporation that is difficult to carry out under atmospheric pressure, which explains that the DLI-CVD techniques used to date all operate under reduced pressure. Thus, according to another characteristic of the process according to the invention, the neutral gas is heated to a temperature that is at least equal to that of the evaporator before penetrating therein.

The vector gas that is used is neutral in that it is not able to oxidize the reagents involved. The nitrogen will preferably be selected as a vector gas for its low cost, but helium or argon, benefiting from a better thermal conductivity, can also be used although they are more expensive. The neutral gas stream that enters the nose of the injector then entrains the precursor and solvent vapors from the evaporator to the deposition zone.

The metal element to be deposited is typically chromium, but it can also be any other metal whose chemistry and metallurgy are similar to those of chromium. One skilled in the art knows the elements for which properties of hardness and chemical inertia that are required in metallurgy are obtained. A metal is selected that can form a bis(arene) compound in which the metal is of degree of oxidation zero. Thus, according to a preferred characteristic of the process according to the invention, the metal element can be selected from among Cr, Nb, V, Mo, Mn, and Hf.

According to an embodiment of the process according to the invention, the precursor of the metal element to be deposited is a compound that does not comprise an oxygen atom. It can be selected from the family of metal bis(arenes) of general formula (Ar)(Ar')M, where M is the metal element of the degree of oxidation zero, and Ar, Ar' each represent an aromatic hydrocarbon cycle, such as benzene or benzene that is substituted by alkyl groups.

Whereby the stability of the metal-ligand bond increases with the number of substituents of the benzene core, a precursor that is selected from among the compounds in which Ar and Ar' represent two identical, sparingly substituted aromatic ligands will be preferred in a particular embodiment of the process according to the invention.

More preferably, the precursor can be selected from the bis(arene)chromium family, preferably from among bis(benzene chromium) or BBC, of formula $Cr(C_6H_6)_2$, bis(cumene) chromium of formula $Cr(C_6H_5iPr)_2$, bis(methylbenzene) chromium of formula $Cr(C_6H_5Me)_2$, and bis(ethyl-benzene) chromium of formula $Cr(C_6H_5Et)_2$. Only the BBC comes in the form of a powder. The other precursors that are cited are liquid and could be directly injected without solvent. The BBC will preferably be selected for its commercial availability, the knowledge of its conventional vacuum MOCVD reactivity and its relatively low decomposition temperature (350° C.).

It is noted that the precursors that have a decomposition temperature of greater than 600° C. are removed. Likewise, the precursors that have too low a decomposition temperature, such as the tetra(alkyl)metal compounds of general formula $M(R)_4$, are excluded. The use of this type of precursor would lead to deposits on the walls of the evaporator under the required temperature and pressure conditions. Diluted in a hydrocarbon solvent, they could catalyze the pyrolysis of the solvent and bring about a very strong contamination of carbon deposits, and even the deposition of carbon compounds only.

The solvent of the precursor compound plays an important role in the good implementation of the process according to the invention. Its selection should correspond to a set of chemical and physical criteria. First of all, the boiling point of the solvent should be less than the temperature of the evaporator to make possible a flash evaporation in the evaporator, typically heated to at least 150° C. The selected solvent should also have a low viscosity to facilitate the entrainment of the solution that can be injected by liquid means up to the evaporator. It should not contain oxygen to avoid the risk of oxidation of the deposits by cracking of the solvent that is used in the deposition zone. It should, of course, be inert chemically with regard to the precursor in solution and liquid under normal conditions. Thus, according to the invention, the solvent is preferably selected from among the liquid hydrocarbons that have a boiling point that is less than 150° C., with general formula $C_xH_y$.

In a convenient manner, the vapor tension will be low enough at atmospheric pressure to allow the storage of the injectable solution without evaporation of the solvent under normal conditions, so as to remove the risks of re-precipitation of the precursor if the initial concentration reached saturation, causing the clogging of the injectors. The light hydrocarbon solvents are therefore removed. The aromatic solvents such as toluene, cyclohexane, or else the linear saturated hydrocarbons for which $x \geq 8$ (n-octane, for example) will therefore be preferred, with the proviso that the other conditions that are set forth be met as well.

Furthermore, according to an advantageous characteristic of the invention, the precursor compound and the solvent are selected such that the saturation concentration of the precursor compound in the solvent is greater than or equal to 0.01M so as to obtain an acceptable precursor flow rate that is much higher than with the conventional saturator sublimation method. In the case of the BBC precursor, toluene or cyclohexane will be preferred as solvent because of their chemical resemblance to the aromatic ligands of the precursor and their relatively low boiling point. The BBC saturation concentration is satisfactory (0.05 mol/l), and its chemical integrity is retained when it is put into solution: the characteristic vibration bands of the BBC in solution in toluene or cylohexane in the UV-Vis range are retained over time if the solution is retained under inert atmosphere.

When it is desired to deposit a nitride or a carbonitride, a reactive nitrogen source should be introduced into the deposition chamber. The nitrogen could be supplied by the precursor compound, but it is preferable that it be provided by a gas, such as ammonia or hydrazine, because it is thus easy to alternate layers of different composition by supplying or not supplying the reactor with nitrogen, while retaining the same precursor. This operation is very simple and instantaneous, whereas the change in precursor solution requires sensitive adjustments and time. According to one advantageous embodiment, in addition to the components already mentioned, a reactive gas that comprises a nitrogen compound is introduced in step b) at the outlet of the evaporator so that in step c), it is entrained with the precursor by the neutral gas stream toward the CVD reactor.

The carbon and/or nitrogen content of the coatings as well as their crystallographic structure can be modulated based on the presence and on the nature of the reactive gas phase (ammonia, hydrazine, . . . ). It thus is possible, with a single piece of equipment, to obtain both carbide deposits as well as carbonitride or a nitride of a metal element.

A process for obtaining multilayer coatings that consist of a stack of layers deposited successively, as described above, whose individual thickness can be several nanometers to one hundred nanometers, is also the object of this invention. The nanostructuring of these multilayer metallurgic coatings imparts to them remarkable properties (protection, resistance to wear, hardness, . . . ), which can be adjusted by monitoring the period and by modifying the nature of the constituent layers. The different phases of the ternary system Cr—N—C can be deposited either individually to take advantage of their specific properties, or alternately to constitute complex multilayer coatings that have properties that are unique and are enhanced by nanostructuring. One skilled in the art clearly knows the advantage of these materials, which it has not been possible to obtain until now except by cumbersome and expensive techniques (PVD only). Thus, according to an advantageous embodiment of the process according to the invention, steps a) to c) are repeated several times to obtain a nanostructured multilayer coating of various non-oxide ceramics.

The multilayer stack can consist of layers of the same metal element from a single precursor solution by varying only the composition of the gas phase during the deposition (namely by adding or not adding the reactive gas). In this case, in an advantageous manner for each repetition of steps b) and c), the same precursor solution is used, and the input flow rate of the reactive gas that comprises a nitrogen-containing compound is modified or reduced to zero.

The multilayer stack can also consist of layers as described above, with a metal element that is different for each one, using an alternate injection of two precursor solutions based on different metal elements. In this case, in an alternative or complementary manner to the modification of the supply of reactive gas, step a) uses at least two solutions that each contain a molecular precursor compound of a different metal whose decomposition temperature is between 300° C. and 550° C., whereby said compounds are dissolved in a solvent lacking an oxygen atom, and step b) alternately introduces said precursor solutions in the form of aerosols in the evaporator that is heated to a temperature of between the boiling point of the solvent and the lowest decomposition temperature of the precursor. Preferably, the solvent is the same for all of the precursor solutions.

The process according to the invention as it was just described makes it possible to carry out a low-temperature chemical vapor-phase deposition under atmospheric pressure to obtain protective ceramic coatings based on chromium or another transition metal, in monolayer or multilayer form. This process is particularly well suited to the coating of metal parts that are designed to be used in the mechanical industry under severe conditions, using a hard protective layer that is resistant to wear, corrosion and oxidation. It can advantageously be used, with suitable adaptations, for the treatment of large plates in a stream.

More generally, a process for the production of a metal part is claimed that is designed to work under severe conditions and that comprises an operation for chemical vapor-phase deposition of at least one layer of a non-oxide ceramic-type hard coating based on carbide, nitride or carbonitride of chromium or a metal element whose chemical properties are similar to those of chromium, in which said chemical vapor-phase deposition is carried out by a process as described above.

Also claimed is a process for production of a metal part that is designed to work under severe conditions, comprising an operation for chemical vapor-phase deposition of several non-oxide ceramic-type layers based on carbides, nitrides or carbonitrides of chromium or a metal element whose chemical properties are similar to those of chromium, whereby said layers form a hard nanostructured coating in which said chemical vapor-phase deposition is carried out by a multilayer deposition process that is described above.

The process that is described above can be applied to the deposition of a non-oxide monolayer or multilayer coating on a metal substrate. As already mentioned above, it is particularly useful for protection against wear and/or the corrosion of metal parts made of steel or alloy.

DETAILED DESCRIPTION OF THE INVENTION

The following examples will make it possible to better understand the advantages of the process according to the invention and to illustrate particular aspects thereof.

EXAMPLE 1

DLI-MOCVD Deposition Device

The DLI-MOCVD device that is used for the deposition of ceramic layers that will be described in detail later consists primarily of a vertical, cold-wall CVD reactor linked to a pulsed injection system that is commercially available. It makes it possible to obtain non-oxide ceramic coatings such as carbides, nitrides and carbonitrides of chromium, as well as nanostructured multilayer stacks of these same coatings.

Figure 1:
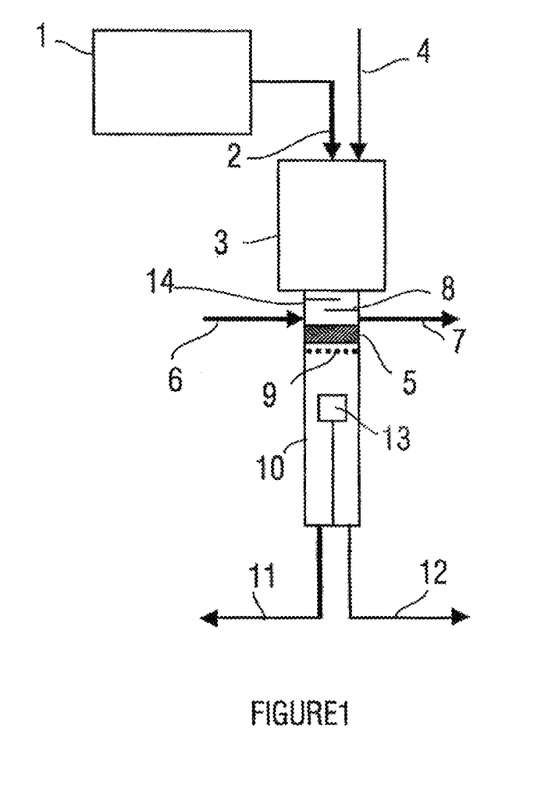
FIG. 1 depicts an evaporator that empties into a deposition chamber that consists of a vertical cold-wall CVD reactor.

In the configuration where it is shown in FIG. 1, it comprises in a central manner an evaporator 3 that empties into a deposition chamber 10 that consists of a vertical cold-wall CVD reactor. A pressurized storage tank 1 for the precursor solution at ambient temperature supplies an injector 2 whose opening toward the evaporator 3 is computer-monitored. A modified diesel automobile injector is conventionally used. A line for feeding vector gas 4 enters the nose of injector 2. A stop valve 5 makes it possible to insulate the evaporator 3 from the deposition chamber 10. The taps 6 and 7 above the stop valve 5 make possible: for one, the intake of the reactive gas, and for the other, the pumping of the evaporator 3 during the cycles for purging or cleaning the latter. The flange 14 on which the taps 6 and 7 are made, as well as the stop valve 5 at the intake of the reactor 10 are heated to a temperature that is close to that of the evaporator 3, i.e., to at least 150° C. The gas stream that enters the nose of the injector 2 entrains the precursor and solvent vapors from the evaporator 3 to the deposition chamber 10, which comprises the susceptor 13 on which the substrate to be coated is placed. A baffle 8 makes it possible to stop the possible droplets that are not evaporated at the outlet of the evaporator 3, and a grid 9 that is pierced by holes uniformly distributes the gas stream, whereby the unit is connected to the deposition chamber 10. This grid 9 makes possible a good distribution of the gas stream at the intake of the deposition chamber 10, which contributes to obtaining a good surface condition of the coatings and a uniform thickness. The evaporator 3 is located co-axially above the CVD reactor 10. The whole unit is equipped with a primary pumping group 11 that makes it possible to purge the system before any implementation. A system for trapping and recycling 12 solvent vapors and by-products of the CVD reaction can be added.

EXAMPLE 2

Obtaining Chromium Carbide Ceramic Coatings from a Bis(Benzene Chromium) Solution in Toluene The Precursor Solution The bisarene-type organometallic chromium precursor: $Cr(C_6H_6)_2$ or BBC, dissolved in degassed and dehydrated toluene on silica gel, is used. The decomposition temperature of the BBC is 350° C. Whereby the saturation concentration of the BBC in toluene determined by UV-Vis spectrophotometry is $5.1 \cdot 10^{-2}$M, a solution with a lower concentration (here, equal to $3.10^{-2}$ mol/l) is prepared to avoid any re-precipitation of the precursor that would run the risk of plugging the injector of the DLI system.

The solution, pressurized at 2.5 bar (relative), is injected at a rate of 1.4 ml/minute at a frequency of 10 Hz and an opening time of 0.5 ms in the evaporator that is heated to 200° C., previously purged with nitrogen and under atmospheric pressure.

The Deposition

The substrates are SS304L steel pellets that have a 1 cm diameter and small Si(100) plates. They are placed on a susceptor made of passivated graphite of SiC or stainless steel. After a purging phase, they are heated by induction to 500° C. under a vector gas stream (here, nitrogen) of 5,000 cm$^3$/min for a 50 mm-diameter reactor (or 4.2 cm/s), itself preheated to the temperature of the evaporator (200° C.). The deposit temperature is monitored by a thermocouple that is housed inside the susceptor. The CVD reactor is under atmospheric pressure.

Figure 2:
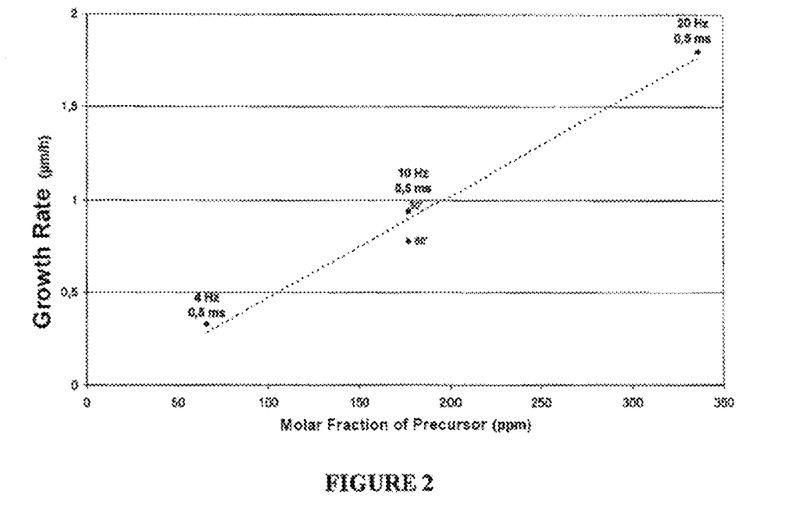
FIG. 2 is a graphical representation of the rate of growth of the coating based on the molar fraction of injected precursor.

The deposition as indicated above is initiated until a layer with a thickness ranging from about ten nanometers to several microns according to the duration of the deposition is obtained. Under the indicated conditions, the rate of growth is 0.75 μm/h. For the same deposition duration, the rate of growth can be multiplied by increasing the frequency of the injector and therefore the precursor flow rate, without modifying the other parameters (opening time of the injector and gas stream). FIG. 2 shows the rate of growth of the coating based on the molar fraction of injected precursor.

For small thicknesses, a gray-metallic mirror deposit is obtained. For larger thicknesses, the roughness of the surface increases, leading to a dull gray surface appearance.

Characterization of the Coatings

These coatings adhere to the 304 L stainless steel mirror polish and to Si. The sectional examination shows a dense morphology. The surface consists of nodules of about one hundred nanometers that are coupled to one another.

Figure 3:
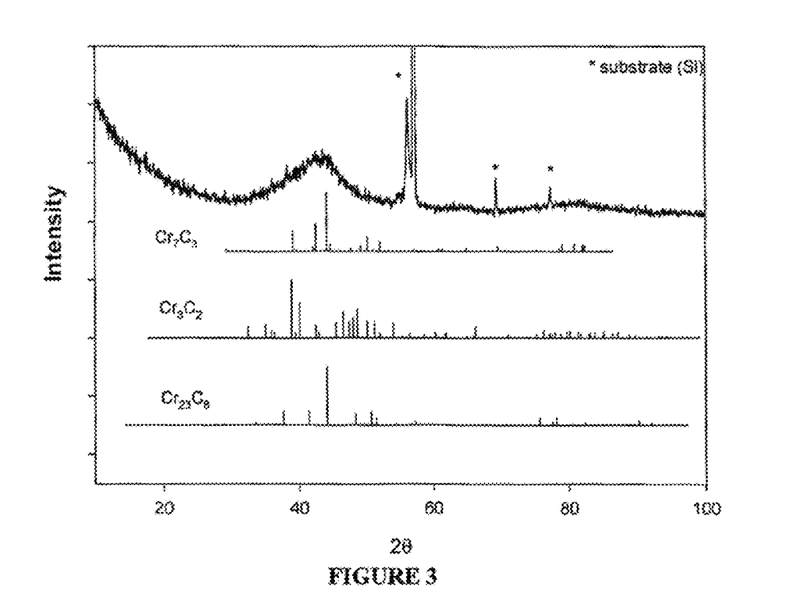
FIG. 3 depicts the grazing-incidence X-ray diffraction diagram of the nanocrystalline chromium carbide coating obtained on a substrate Si.

X-Ray diffraction analyses have been carried out. The grazing-incidence X-ray diffraction diagram of the nanocrystalline chromium carbide coating obtained on a substrate Si is presented in FIG. 3. It shows a virtually amorphous structure, considered to be nanocrystalline because the X-ray diagrams have 3 very broad low-intensity peaks that are centered on the chromium carbide lines. Microprobe analyses (EPMA) disclose a chemical composition that is close to $Cr_7C_3$.

For a deposit with a thickness of 1 μm, the hardness values that are measured by nanoindentation are close to 14 GPa with a Young's module of 250 GPa. The internal macroscopic constraints are slightly compressive (−1 GPa) on stainless steel, allowing good adhesion of the film to a metal substrate.

Although stainless steel is already recognized for its excellent properties in terms of corrosion, preliminary corrosion tests in a saline environment have shown a significant improvement in resistance to corrosion of 304L stainless steel using the chromium carbide coating in question. Preliminary tests of polarization and electrochemical impedance spectroscopy have been carried out in a 0.1M NaCl solution. The polarization test shows a behavior of the steel that is coated by 1 μm of amorphous chromium carbide that is similar to that of bare stainless steel (passivation stage, then pitting). The cathode-current density is greatly reduced, by nearly two decades. The pitting potential is almost the same as that of the bare stainless steel, except that the intensity of the passivation current is reduced significantly (by virtually two decades). The observation of surfaces after polarization shows that the pitting density is very restricted for the coated steel. The Bode diagrams that are obtained from impedance spectroscopy tests around the corrosion potential prove that the stabilization of the theta phase at low frequencies for the amorphous $Cr_7C_3$-coated steel is characteristic of a capacitive behavior. The polarization strength reflects the strength of samples tested for corrosion: in the case of coated stainless steel, it is quite superior to that of the uncoated stainless steel ($2.10^7$ W·cm$^2$ against $4.10^6$ W·cm$^2$).

EXAMPLE 3

Obtaining Chromium Carbide Ceramic Coatings from a Bis(Benzene Chromium) Solution in Cyclohexane The procedure is the same as the one that is used in Example 2, except that the BBC chromium precursor is dissolved in cyclohexane at a rate of $1.4 \cdot 10^{-2}$ mol. The rate of growth is 0.4 μm/h (lower than above due to the lower precursor concentration in the solvent).

Figure 4:
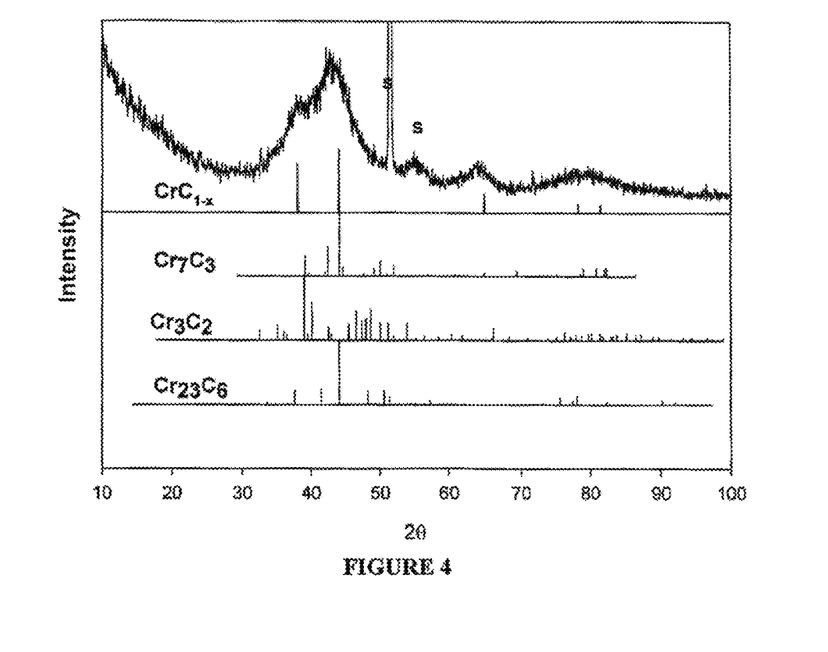
FIG. 4 is a graphical representation of X-Ray diffraction analyses showing a virtually amorphous structure, considered to be nanocrystalline because the X-ray diagrams have five very broad low-intensity peaks but this time they are centered on the lines of a metastable chromium carbide $CrC_{1-x}$.

A dull metallic gray deposit is obtained. X-Ray diffraction analyses show a virtually amorphous structure, considered to be nanocrystalline because the X-ray diagrams have five very broad low-intensity peaks but this time they are centered on the lines of a metastable chromium carbide $CrC_{1-x}$. (FIG. 4) Castaing microprobe analyses (EPMA) reveal a chemical composition that is close to $Cr_7C_3$. These coatings adhere to the 304L stainless steel mirror polish and to Si.

EXAMPLE 4

Obtaining Chromium Nitride CrN Ceramic Coatings

The procedure is the same as the one that is followed in Example 2. The injectable solution contains the BBC chromium precursor dissolved in toluene. High-purity ammonia (99.99%) enters via the pitting 6 of the flange 14 that connects the evaporator to the CVD reactor.

Three coatings of different compositions have been produced, with the following $NH_3$/BBC molar ratios, such as the sum of $NH_3$ flow rate+$N_2$ flow rate=5,000 cm$^3$/mn:

| $NH_3$/BBC | amount of ammonia provided |
|---|---|
| 160 | 150 cm$^3$/mn |
| 300 | 300 cm$^3$/mn |
| 600 | 560 cm$^3$/mn |

A dark gray deposit with a metallic luster is obtained for thicknesses of several hundreds of nanometers. For larger thicknesses, the surface becomes rougher and diffuses the light, which gives a milky appearance to the samples of Si or the coated steel. For thicknesses of up to 2 μm, the CrN-coated samples retain, however, a metallic luster.

Figure 5:
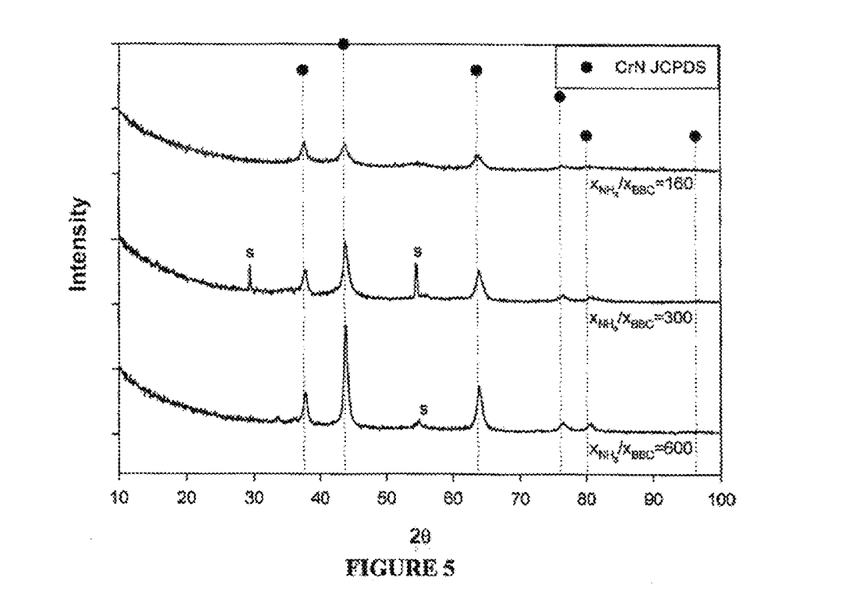
FIG. 5 is a graphical representation of the X-ray diffraction analyses for the three coatings.

The X-ray diffraction analyses are presented in FIG. 5 for the three coatings. They show a CrnN-type nanocrystalline structure, i.e., face-centered cubic, as the good agreement with the positions and intensities of the peaks reported in literature and shown by the dots confirms. The crystallinity of the deposits seems to increase with the NH/BBC molar ratio.

The chemical composition that is determined by electronic microprobe EPMA (electron probe, microanalysis) is globally $Cr_{0.50}N_{0.50-x}O_x$, with x not exceeding 10% atomic oxygen in the deposit. Despite precautions taken on the sealing of the DLI-MOCVD frame that is used, the incorporation of several percent of atomic oxygen is inevitable, taking into account the strong affinity of chromium and in particular of CrN for oxygen.

The coatings that are obtained on 304L stainless steel are adhesive and dense just like on Si. Compressive constraints of 2 GPa have been measured, and this state of macroscopic internal constraints seems to become increasingly compressive with the increase in the thickness of the deposits. They have remarkable mechanical properties and remarkable resistance to corrosion: the hardness that is obtained by nanoindentation is 23.1±1.5 GPa for films of small thicknesses (less than 300 nm). The nanohardness falls to 15 GPa for CrN coatings with a thickness of 1.7 μm. By contrast, the Young's module is relatively high (280 GPa), always reflecting the ceramic properties of the CrN deposits.

Corrosion tests that are identical to those of Example 2 have been conducted on a 304 L stainless steel sample that is coated by a CrN coating with a thickness of 1.7 μm. The cathode-current density is reduced by more than two decades (the cathode-current density of the steel that is coated with CrN is $1.3 \cdot 10^{-6}$ A/cm$^2$ for —IV/ECS, whereas it is $0.5 \cdot 10^{-6}$ A/cm$^2$ with the same potential for bare steel). Furthermore, the corresponding Bode diagrams show a quite capacitive nature for the CrN-coated steel. The polarization strength is $2 \cdot 10^{-7} \Omega \cdot cm^2$ for the CrN-coated sample, and only $4 \cdot 10^{-6}$ $\Omega \cdot cm^2$ for the bare stainless steel. This clearly shows the improvement of the stainless steel's resistance to corrosion by the presence of the CrN coating.

EXAMPLE 5

Obtaining CrN/CrC Multilayer Ceramic Coatings

The deposition procedure is the same as the one that is described in Example 2, except that the ammonia feed line is periodically opened and closed. No purging is necessary for the alternation of a layer of a different nature, whereby the gas flow rate is high under the selected conditions. However, purges can be applied to increase the quality of the interfaces. These purges can be programmed, just like the operation of the injectors. The periodicity of the ammonia supply is regulated based on the respective growth rates for the two types of materials.

CrN/CrC Multilayer Coating with a Period of 100 nm

A first coating (R1) was carried out by deposition of ten alternating layers of CrC (injection parameters: 10 Hz and 0.3 ms) and CrN (injection parameters: 10 Hz and 0.5 ms) on nitrated silicon substrate. The ammonia is supplied for 14,328 seconds at a rate of 300 cm$^3$/mn, with 4,786-second interruptions.

CrN/CrC Multilayer Coating with a Period of 50 nm

A second coating (R2) was carried out by deposition of twenty alternating layers of CrC and CrN on nitrated silicon substrate. The ammonia is supplied for 7,164 seconds at a rate of 300 cm$^3$/mn, with 2393-second interruptions.

The SIMS (Secondary Ion Mass Spectrometry) profiles of the two coatings have been established for the fragments $^{52}$Cr, $^{133}$Cs$^{29}$Si, $^{133}$Cs$^{212}$C, and $^{133}$Cs$^{214}$N.

Figure 6:
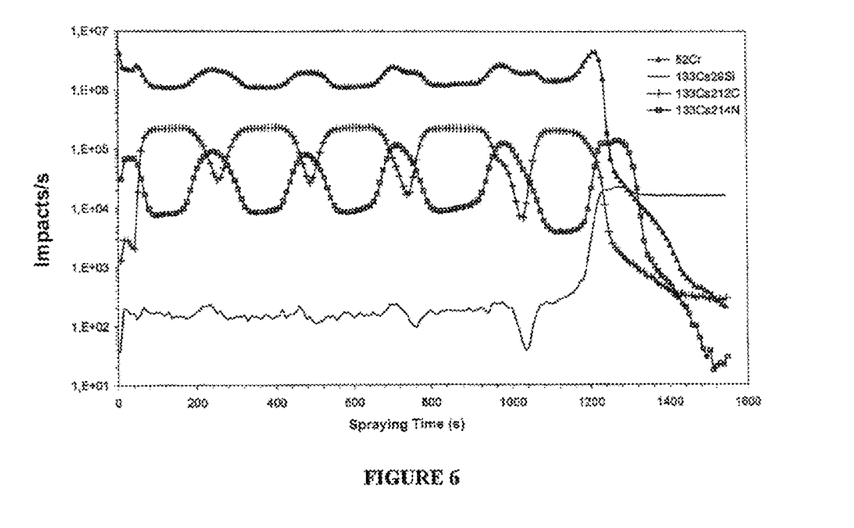
FIG. 6 is a graphical representation of the stacking of ten alternating layers of CrC and CrN with a target thickness of 100 nm each (coating R1)

FIG. 6 shows the stacking of ten alternating layers of CrC and CrN with a target thickness of 100 nm each (coating R1).

Figure 7:
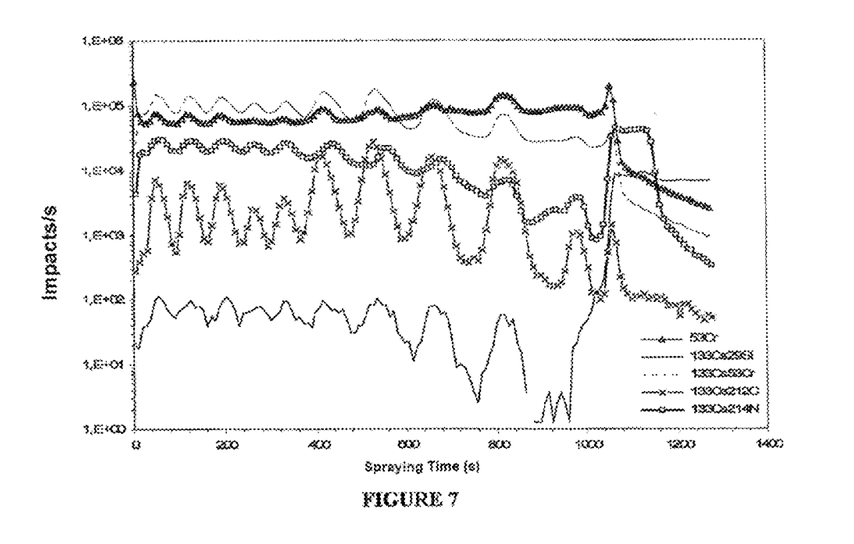
FIG. 7 is a graphical representation of the stacking of twenty alternating layers of CrC and CrN with a target thickness of 50 NM each (coating R2).

FIG. 7 shows the stacking of twenty alternating layers of CrC and CrN with a target thickness of 50 nm each (coating R2).

The multilayer coatings that are obtained adhere to the 304L stainless steel mirror polish and are dense in section. They have a relatively smooth surface condition. They have remarkable mechanical properties and a remarkable corrosion resistance: the nanoindentation measurements on the multilayer coating R1 with a period of 100 nm show a hardness of 19 GPa. Relative to the multilayer coating R2 with a period of 50 nm, the hardness rises to 25 GPa. It therefore appears that the nanostructuring has a beneficial effect on the hardness properties. The Bode diagrams show that the polarization resistance of the coated steel is greater (namely $2 \cdot 10^{-7}$ $\Omega \cdot cm^2$) than in the case for the uncoated steel. These results reflect a good corrosion behavior.

The invention claimed is:

1. A process for depositing a non-oxide ceramic coating of carbides, nitrides or carbonitrides of chromium or of another metal whose chemical properties are similar to chromium, by chemical vapor-phase deposition on a metal substrate, comprising the steps of:
   a) providing a precursor solution that contains a metal precursor compound to be deposited, said compound belonging to the bis(arene) family and having a decomposition temperature between 300° C. and 550° C., whereby said compound is dissolved in an oxygen-free solvent,
   b) introducing said precursor solution in aerosol form into an evaporator that is heated to a temperature of between the boiling point of the solvent and the decomposition temperature of the precursor, and
   c) entraining the precursor compound and the solvent that are evaporated by a neutral gas stream from the evaporator to a cold-wall CVD reactor comprising a susceptor that supports the substrate to be coated, wherein the susceptor is heated to a temperature that is higher than the decomposition temperature of the precursor and at most 550° C.,
   whereby the evaporator and the CVD reactor are subjected to atmospheric pressure.

2. The process according to claim 1, wherein the evaporator is heated at a temperature that is at least 50° C. less than the decomposition temperature of the precursor compound.

3. The process according to claim 2, wherein the aerosol is obtained by injection in pulsed mode with an opening time that is less than 1 ms and a frequency that is greater than 4 Hz.

4. The process according to claim 2, wherein the neutral gas is heated to a temperature that is at least equal to that of the evaporator before penetrating therein.

5. The process according to claim 1, wherein the aerosol is obtained by injection in pulsed mode with an opening time that is less than 1 ms and a frequency that is greater than 4 Hz.

6. The process according to claim 1, wherein the neutral gas is heated to a temperature that is at least equal to that of the evaporator before penetrating therein.

7. The process according claim 1, wherein the neutral gas in the evaporator has a flow rate between 4 cm/s and 10 cm/s.

8. The process according to claim 1, wherein the metal whose chemical properties are similar to chromium is selected from the group consisting of Cr, Nb, V, Mo, Mn and Hf.

9. The process according to claim 1, wherein the precursor compound does not comprise an oxygen atom, and is selected from the family of metal bis(arenes) of general formula (Ar)(Ar')M, where
   M is a metal element of a degree of oxidation zero, and
   Ar, Ar' each represent an aromatic hydrocarbon cycle.

10. The process according to claim 9, wherein Ar and Ar' represent two identical, sparingly substituted aromatic ligands.

11. The process according to claim 1, wherein the precursor is selected from the family of bis(arene)chromium.

12. The process according to claim 11, wherein the precursor is bis(benzene chromium), bis(cumene)chromium, bis(methylbenzene)chromium or bis(ethylbenzene)chromium.

13. The process according to claim 1, wherein the solvent is selected from the group consisting of liquid hydrocarbons that have a boiling point that is less than 150° C., of general formula $C_xH_y$.

14. The process according to claim 1, wherein the precursor compound and the solvent are selected such that a saturation concentration of the precursor compound in the solvent is greater than or equal to 0.01 M.

15. The process according to claim 1, wherein step b) further comprises introducing a reactive gas that comprises a nitrogen-containing compound at an outlet of the evaporator, such that in step c), the nitrogen-containing compound is entrained with the precursor compound by the stream of neutral gas toward the CVD reactor.

16. A process for production of a metal part, comprising depositing several layers of a non-oxide, ceramic coating on said metal part by the process according to claim 15.

17. The process according to claim 1, wherein steps a) to c) are repeated two or more times to obtain a nanostructured multilayer coating of different non-oxide ceramics.

18. The process according to claim 17, wherein for each repetition of steps b) and c), the same precursor solution is used, and an input flow rate of the reactive gas that comprises a nitrogen-containing compound is modified or reduced to zero.

19. The process according to claim 17, wherein step a) provides at least two precursor solutions, each solution containing a precursor compound of a different metal that belongs to the bis(arene) family and having a decomposition temperature between 300° C. and 550° C., whereby said compounds are dissolved in an oxygen-free solvent, and step b) alternately introduces each of said precursor solutions in aerosol form into the evaporator that is heated to a temperature of between the boiling point of the solvent and the lowest decomposition temperature of the at least two precursors.

20. A process for production of a metal part, comprising depositing at least one layer of a non-oxide ceramic coating on said metal part by the process according to claim 1.

* * * * *